US009788404B2

(12) United States Patent
Nettesheim et al.

(10) Patent No.: US 9,788,404 B2
(45) Date of Patent: Oct. 10, 2017

(54) APPARATUS FOR PRODUCING A PLASMA AND HAND-HELD DEVICE HAVING THE APPARATUS

(71) Applicants: relyon plasma GmbH, Regensburg (DE); EPCOS AG, Munich (DE)

(72) Inventors: Stefan Nettesheim, Berlin (DE); Dariusz Korzec, Wenzenbach (DE); Dominik Burger, Alteglofsheim (DE); Georg Kuegerl, Eibiswald (AT); Markus Puff, Graz (AT); Florian Hoppenthaler, Regensburg (DE)

(73) Assignees: EPCOS AG, Munich (DE); reylon plasma GmbH, Regensburg (DE)

( * ) Notice: Subject to any disclaimer, the term of this patent is extended or adjusted under 35 U.S.C. 154(b) by 0 days.

(21) Appl. No.: 14/806,241

(22) Filed: Jul. 22, 2015

(65) Prior Publication Data
US 2015/0373824 A1    Dec. 24, 2015

Related U.S. Application Data

(63) Continuation of application No. PCT/IB2014/058115, filed on Jan. 8, 2014.

(30) Foreign Application Priority Data

Jan. 22, 2013  (DE) .................. 10 2013 100 617

(51) Int. Cl.
*H05H 1/24* (2006.01)
*H01L 41/053* (2006.01)
*H01L 41/107* (2006.01)

(52) U.S. Cl.
CPC ............. *H05H 1/24* (2013.01); *H01L 41/053* (2013.01); *H01L 41/107* (2013.01);
(Continued)

(58) Field of Classification Search
None
See application file for complete search history.

(56) References Cited

U.S. PATENT DOCUMENTS 5,834,882 A * 11/1998 Bishop ............... H01L 41/107
310/333
6,294,881 B1 * 9/2001 Miyazaki ............ H01J 61/56
310/316.03
(Continued)

FOREIGN PATENT DOCUMENTS

CN        101259036 A       9/2008
DE     102005032890 B4      1/2007
(Continued)

OTHER PUBLICATIONS

Nadal C et al: "First Approach for the Modelling of the Electric Field Surrounding a Piezoelectric Transformer in View of Plasma Generation", IEEE Transactions on Magnetics, IEEE Service Center, New York, NY, US, vol. 48, No. 2, Feb. 2, 2012 (Feb. 2, 2012), pp. 423-426, XP011398344, ISSN: 0018-9464, DOI: 10.1109/TMAG.2011.2174970.
(Continued)

*Primary Examiner* — Douglas W Owens
*Assistant Examiner* — Srinivas Sathiraju
(74) *Attorney, Agent, or Firm* — Simpson & Simpson, PLLC

(57) ABSTRACT

An apparatus for producing a plasma including a control circuit which is electrically connected to a piezoelectric transformer in order to excite the piezoelectric transformer. A hand-held device that uses the apparatus. The piezoelectric transformer is constructed of several layers. The control circuit is implemented on a circuit board, and the piezoelectric transformer is held over the circuit board by means of a region of a first end. A high voltage is applied to a second
(Continued)

free end of the piezoelectric transformer. The plasma is produced at atmospheric pressure.

14 Claims, 6 Drawing Sheets

(52) U.S. Cl.
CPC . *H05H 2001/2481* (2013.01); *H05H 2240/10* (2013.01); *H05H 2245/123* (2013.01)

(56) References Cited

U.S. PATENT DOCUMENTS

| | | | | |
|---|---|---|---|---|
| 8,129,653 | B2* | 3/2012 | Kirchmeier | H01J 37/32045 219/121.36 |
| 8,267,884 | B1* | 9/2012 | Hicks | A61B 18/042 315/111.21 |
| 8,710,761 | B2 | 4/2014 | Pauritsch et al. | |
| 9,288,886 | B2* | 3/2016 | Koo | A61B 18/042 |
| 9,314,603 | B2* | 4/2016 | Kummerfeld | A61M 37/00 |
| 9,422,799 | B2* | 8/2016 | Ageev | H05H 1/52 |
| 2009/0009090 | A1* | 1/2009 | Viol | H05H 1/2406 315/111.21 |
| 2009/0122941 | A1* | 5/2009 | Engemann | H01L 41/107 376/145 |
| 2009/0206062 | A1 | 8/2009 | Kuo | |
| 2010/0301702 | A1 | 12/2010 | Tao et al. | |
| 2012/0187841 | A1* | 7/2012 | Kindel | A61B 18/042 315/111.21 |
| 2012/0242229 | A1* | 9/2012 | Hoffman | H05H 1/46 315/111.51 |
| 2012/0255932 | A1* | 10/2012 | Tabib-Azar | H05H 1/32 216/63 |
| 2013/0001196 | A1* | 1/2013 | Hoffman | H05H 1/46 216/67 |
| 2013/0072860 | A1* | 3/2013 | Watson | A61M 16/12 604/23 |
| 2013/0204244 | A1* | 8/2013 | Sakakita | A61B 18/042 606/40 |

FOREIGN PATENT DOCUMENTS

| | | |
|---|---|---|
| DE | 202008008980 U1 | 10/2008 |
| DE | 102007055014 A1 | 5/2009 |
| DE | 102008018827 B4 | 10/2009 |
| DE | 102008063052 A1 | 1/2010 |
| DE | 102009023505 A1 | 12/2010 |
| DE | 102009038563 A1 | 2/2011 |
| DE | 102011006764 A1 | 10/2012 |
| EP | 1814168 A1 | 8/2007 |
| EP | 2256835 A2 | 12/2010 |
| JP | 2003297295 A | 10/2003 |
| JP | 2007-281356 A | 10/2007 |
| WO | 2007006298 A2 | 1/2007 |

OTHER PUBLICATIONS

Teranishi K et al: "A novel generation method of dielectric barrier discharge and ozone production using a piezoelectric transformer", Japanese Journal of Applied Physics Part.2, The Japan Society of Applied Physics, Japan Society of Applied Physics, Tokyo; JP, vol. 43, No. 9B, Published Sep. 22, 2004 (Sep. 2, 2004), pp. 6733-6739, XP002432140, ISSN: 0021-4922, DOI: 10.1143/JJAP.43.6733.

Teschke M., Engemann J.: "Low voltage APP-generation by piezo ceramics: A new revolutionary enabling technology", 18th Internat. Symposium on Plasma Chemistry (ISPC), 27A-A4, Aug. 26, 2007 (Aug. 26, 2007),-Aug. 31, 2007 (Aug. 31, 2007), XP7922582, Kyoto, Japan.

Kim Hyun et al: "Atmospheric pressure argon plasma jet using a cylindrical piezoelectric transformer", Applied Physics Letters, American Institute of Physics, US, vol. 95, No. 21, Nov. 24, 2009 (Nov. 24, 2009), pp. 211501-211501, XP012126559, ISSN: 0003-6951, DOI: 10 .1063/1. 3267142.

Rajasekaran P., Bibinov N., Awakowicz P.: "Atmospheric-pressure piezo-driven microplasma source for bio-medical applications", Institute for Electrical Engineering and Plasma Technology, Apr. 13, 2011 (Apr. 13, 2011), XP7922580, Bochurn.

Itoh H et al: "Discharge plasmas generated by piezoelectric transformersand their applications; Discharge plasmas generated by piezoelectric transformers", Plasma Sources Science and Technology, Institute of Physics Publishing, Bristol, GB, vol. 15, No. 2, May 2, 2006 (May 2, 2006), pp. S51-S61, XP020105199, ISSN: 0963-0252, DOI: 10.1088/0963-0252;15/2/S07, Published Apr. 24, 2006.

Clement Nadal et al: "Analytical modeling of electrical potential repartition on piezoelectric transformer", Frequency Control Symposium (FCS), 2010 IEEE International, IEEE, Piscataway, NJ, USA, Jun. 2, 2010 (Jun. 2, 2010), pp. 602-607, XP031738445, ISBN: 978-1-4244-6399-2 p. 603, paragraph II. Analytical Model of Rosen PT; table I.

Piezoelektrische Transformatoren—Schaltungen und Anwendungen by C. Kauczor / T. Schulte / H Grotstollen, Piezoelectric transformers—circuits and applications, 47. internationalies Wissenschaftliches Kolloquim, Technische Universitaet Ilmenau, Sep. 23-26, 2002.

"High Efficiency Ozone Production by a Compact Ozoniser Using Piezoelectric Transformer". Kenji Teranishi, Susumu Suzuki and Haruo Itoh (Chiba Institute of Technology). Date Unknown.

* cited by examiner

APPARATUS FOR PRODUCING A PLASMA AND HAND-HELD DEVICE HAVING THE APPARATUS

CROSS-REFERENCE TO RELATED APPLICATIONS

This application is filed under 35 U.S.C. §111(a) and §365(c) as a continuation of International Patent Application PCT/IB2014/058115, filed Jan. 8, 2014, which application claims priority from German Patent Application No. DE 10 2013 100 617.5, filed Jan. 22, 2013, which applications are incorporated herein by reference in their entireties.

TECHNICAL FIELD

The invention relates to a device or an apparatus for producing a plasma. For this purpose there is, in particular, a control circuit that is electrically connected to a piezoelectric transformer, in order to excite said piezoelectric transformer.

Furthermore, the invention relates to a hand-held device for plasma treatment of surfaces. The hand-held device has a housing and a voltage source.

BACKGROUND OF THE INVENTION

The German patent DE 10 2008 018 827 B4 discloses a device for producing a plasma with a piezoelectric element. The piezoelectric element is equipped with a primary and a secondary region. In this case the primary region of the piezoelectric element is driven with a low voltage and at a high frequency. As a result, the plasma is ignited by the enhancement of the field on the surface of the secondary region of the piezoelectric element. According to the invention, the plasma feed is carried out by means of a counter electrode, located at ground potential, and a gas current, which sweeps past the piezoelectric element. The gas flow allows the plasma to issue from the device.

The German published patent application DE 10 2011 006 764 A1 discloses a piezoelectric transformer with an input-side piezoelectric transducer, an output-side piezoelectric transducer with at least two phases, at least a first electrically non-conductive layer, which is disposed between the input-side piezoelectric transducer and the output-side piezoelectric transducer and which mechanically couples together the input-side piezoelectric transducer and the output-side piezoelectric transducer. Furthermore, at least a second electrically non-conductive layer is disposed between the phases of the output-side piezoelectric transducer.

The U.S. Pat. No. 5,834,882 describes the construction of a multi-layer piezoelectric transformer. A first electroactive member is mechanically coupled to the second electroactive member by means of a bonding layer, which is disposed between a first major face of the first electroactive member and a first major face of the second electroactive member. The bonding layer comprises pre-stressing means for applying compressive stress to the first and the second electroactive members in the longitudinal direction.

The German published patent application DE 10 2009 023 505 A1 discloses a circuit arrangement for a piezoelectric transformer and a method for driving a piezoelectric transformer. The circuit arrangement comprises a driver circuit, a current sensor, a control unit and an oscillator. Furthermore, the circuit arrangement comprises a pulse width modulator. The pulse width modulator is connected between the oscillator and the driver circuit. The oscillator output is connected to an input of the pulse width modulator. A modulator output of the pulse width modulator is connected to the driver signal input. Another modulator output of the pulse width modulator is connected to an additional driver signal input of the driver circuit. An output of the control unit is connected to a modulator control input of the pulse width modulator. A secondary-side voltage, which is used, for example, to trigger a flash, can be tapped at the piezoelectric transformer.

The German published patent application DE 10 2007 055 014 A1 discloses a method for igniting and maintaining a plasma in a gas chamber. The piezoelectric material protrudes into a hollow space, so that the piezoelectric material is caused to resonantly oscillate due to an external electrical excitation. The hollow space contains the gas to be ionized. The electrodes are attached to the exterior of the piezoelectric material. The method lends itself to providing a plasma light source.

The Chinese patent application CN 101259036 A discloses a micro plasma pen for removing freckles. The pen comprises a plasma head for cleaning the skin, a handle housing, a micro transducer, which is arranged in the handle housing, a power output controller and a power module. The pen can deliver a high and variable plasma power output, for which an integrated circuit or a semiconductor chip microprocessor is installed in the handle housing, where in this case the integrated circuit drives a piezoelectric transformer.

The European patent application EP 2 256 835 A2 discloses a pulse generator for a piezoelectric transformer. An output stage of the amplifier drives the piezoelectric transformer at a desired resonant frequency. Two electrodes are connected to the piezoelectric transformer. The voltage, forming at the piezoelectric transformer, is adequate enough to form a dielectric barrier discharge. The generator for the dielectric barrier discharge consists of a tube or a dish. The high voltage electrode is located, for example, in a tube at ground potential.

The German patent DE 10 2005 032 890 B4 discloses a device for producing an atmospheric pressure plasma by means of at least one piezoelectric transformer. Such a transformer is made of a piezoelectric material that is divided in the longitudinal direction into at least one excitation zone and at least one high voltage zone. According to the invention, the piezoelectric transformer has at least one opening that is designed for the gas feed and that is traversed by a gas stream, as a result of which plasma can be produced in the opening.

The German utility model DE 20 2008 008 908 U1 discloses a device for producing an atmospheric pressure plasma. A gas inflow opening, which can be connected to a gas line, and an in-feed line for supplying power to the device are both connected to a power supply device.

The Japanese patent application 2003-297295 discloses a light emitting element that comprises a piezoelectric element. The piezoelectric element is excited by means of an AC voltage.

The German published patent application DE 10 2008 063 052 A1 discloses a device for cleaning the air in a room. The device comprises a housing, in which at least one opening for the intake of ambient air and at least one outlet opening for blowing out the cleaned air are provided. In this case a device for producing plasma can be disposed in the housing in such a way that germs or unpleasant odors can be eliminated.

The article "Piezoelectric Transformers—Circuits and Applications" by C. KAUCZOR, T. SCHULTE, H. GROTSTOLLEN; 47th International Colloquium, Ilmenau University of Applied Sciences, Sep. 23 to 26, 2002. The piezoelectric transformers are a suitable alternative to conventional transformers. The driving voltage is coupled into the primary side; and on the output side (secondary side) the voltage is amplified.

The article "High Efficiency Ozone Production by a Compact Ozonizer Using Piezoelectric Transformer", by Kenji TERANISHI, Susumu SUZUKI and Haruro ITOH, Chiba Institute of Technology, discloses that the piezoelectric transformer is held at vibration nodal points. The excitation energy is fed into a first half of the piezoelectric transformer. The second half of the piezoelectric transformer is positioned between two electrodes for the barrier discharge. Just the formation of plasma alone on the free end of the piezoelectric transformer is not provided.

SUMMARY OF THE INVENTION

The present invention broadly includes an apparatus for producing a plasma including a control circuit which is electrically connected to a piezoelectric transformer in order to excite the piezoelectric transformer. A hand-held device that uses the apparatus. The piezoelectric transformer is constructed of several layers. The control circuit is implemented on a circuit board, and the piezoelectric transformer is held over the circuit board by means of a region of a first end. A high voltage is applied to a second free end of the piezoelectric transformer. The plasma is produced at atmospheric pressure.

The present invention broadly includes an apparatus for producing a plasma with a control circuit, which is electrically connected to a piezoelectric transformer, in order to excite piezoelectric transformer, and a printed circuit board, on which the control circuit is realized. The piezoelectric transformer is mounted with a region of a first end with respect to the printed circuit board, a high voltage can be impressed on a second free end of the piezoelectric transformer, and the plasma can be ignited at atmospheric pressure. A current of a working gas for forming the plasmas and for cooling the piezoelectric transformer flows. The piezoelectric transformer is constructed from a plurality of layers of dielectric material, wherein the layers are connected to each other, wherein each layer is provided at least partially with a conductor layer and the piezoelectric transformer is freely spaced apart from the printed circuit board by a gap in the region of the first end.

The present invention broadly includes an apparatus for producing a plasma which can be ignited at atmospheric pressure including a control circuit, which is electrically connected to a piezoelectric transformer, to excite the piezoelectric transformer, a printed circuit board, on which the control circuit is realized, a region of a first end of the piezoelectric transformer to mount the piezoelectric transformer with respect to the printed circuit board, a high voltage which can be impressed on a second free end of the piezoelectric transformer and a current of a working gas for forming the plasmas and for cooling the piezoelectric transformer. The piezoelectric transformer is constructed from a plurality of layers of dielectric material. The layers are connected to each other and each layer is provided at least partially with a conductor layer and the piezoelectric transformer is freely spaced apart from the printed circuit board by a gap in the region of the first end.

The present invention broadly includes a hand-held device for plasma treatment of surfaces, the hand-held device including a housing, a voltage source and a printed circuit board, which is provided in the housing and which has a control circuit, in order to excite a piezoelectric transformer, wherein the piezoelectric transformer is guided with a first end with a holder above the printed circuit board and, thus, forms a structural unit, and wherein a second free end of the piezoelectric transformer is directed towards an opening in the housing, wherein a high voltage can be impressed on the second free end of the piezoelectric transformer, and the plasma can be ignited at atmospheric pressure. A current of a working gas for forming the plasmas and for cooling the piezoelectric transformer flows. The piezoelectric transformer is constructed from a plurality of layers of dielectric material, wherein the layers are connected to each other. Each layer is provided at least partially with a conductor layer and the piezoelectric transformer is freely spaced apart from the printed circuit board by a gap in a region of the first end.

The present invention broadly includes a hand-held device for plasma treatment of surfaces, the hand-held device including a housing, a voltage source, a printed circuit board, which is provided in the housing and which has a control circuit in order to excite a piezoelectric transformer. The piezoelectric transformer is guided with a first end with a holder above the printed circuit board and, thus, forms a structural unit. A second free end of the piezoelectric transformer is directed towards an opening in the housing. A high voltage can be impressed on the second free end of the piezoelectric transformer and the plasma can be ignited at atmospheric pressure. The hand-held device further includes a current of a working gas for forming the plasma and for cooling the piezoelectric transformer. The piezoelectric transformer is constructed from a plurality of layers of dielectric material. The layers are connected to each other. Each layer is provided at least partially with a conductor layer and the piezoelectric transformer is freely spaced apart from the printed circuit board by a gap in a region of the first end.

The present invention relates to a device for producing atmospheric pressure plasma by means of at least one piezoelectric transformer. Such a transformer is made of a piezoelectric material that is divided in the longitudinal direction into at least one excitation zone and at least one high voltage zone. According to the present invention, the piezoelectric transformer has at least one opening, which is designed for the gas feed and which is traversed by a gas stream, as a result of which plasma can be produced in the opening. According to an additional embodiment of the invention, the directions of polarization of the two zones of the transformer are designed in such a way that plasma, for example, for supplying power to a lamp with corresponding electrodes, is produced at the surface of the high voltage zone itself.

The object of the present invention is to provide a device that is simple and inexpensive, so that the device can be used to produce a plasma at atmospheric pressure.

An additional object of the invention is to propose a hand-held device that is designed for the plasma treatment of surfaces at atmospheric pressure and that is constructed in a cost-effective and simple way.

The inventive device for producing a plasma is characterized by a control circuit, which is electrically connected to the piezoelectric transformer in order to excite said piezoelectric transformer. The piezoelectric transformer is constructed of a plurality of individual layers. The piezoelectric transformer consists of a stack of a plurality of films of a dielectric material, where in this case a conductor track or more specifically a conductive surface is applied to a section of each film. The section of the film with the conductor track is in a section of a first end of the piezoelectric transformer. The individual films are connected to each other in a sintering process; and, in this way the piezoelectric transformer is formed.

The control circuit for driving the piezoelectric transformer is realized on a printed circuit board. As a rule, the piezoelectric transformer is supplied with a voltage, which excites the piezoelectric transformer in accordance with its resonant frequency. The control circuit is also used to adjust the excitation voltage, in the event that the resonant frequency of the piezoelectric transformer changes due to temperature effects and aging processes. Similarly the resonant frequency of the piezoelectric transformer can also drift due to a change in the dielectric properties of the environment or due to the intensity of the discharge that is ignited in the gaseous environment. The piezoelectric transformer is held or rather guided with a region of a first end above the printed circuit board. Owing to the excitation voltage, a high voltage is impressed on a second free end of the piezoelectric transformer. Then on the second free end the plasma ignites at atmospheric pressure. The holder for the piezoelectric transformer holds or more specifically guides said piezoelectric transformer at a vibration nodal point. A gap is formed between the printed circuit board and the piezoelectric transformer, so that the piezoelectric transformer and the printed circuit board are spaced apart from each other. This arrangement makes it possible to eliminate a mechanical damping of the piezoelectric transformer.

The piezoelectric transformer itself is parallel pipe-shaped, where in this case one length and one width of the piezoelectric transformer are greater than one thickness of the piezoelectric transformer. At the same time the multiple layers of the piezoelectric transformer are oriented in such a way that they are more or less perpendicular to the lateral faces of the piezoelectric transformer, said lateral faces being defined by the length and the thickness of the piezoelectric transformer.

An electrical connector for the excitation voltage is provided in each instance at the mutually opposite lateral faces of the piezoelectric transformer. Preferably the electrical connector is mounted at a vibration nodal point of the piezoelectric transformer. The holder for the piezoelectric transformer is also provided at the vibration nodal point of the piezoelectric transformer. In the event that a separate electrical connector for the excitation voltage is guided to the terminal pad, it is sufficient that the holder is made of an elastic material. If the excitation energy for the piezoelectric transformer is supplied by way of the holder, then the material of the holder is elastic and electrically conductive.

A current of a working gas is formed in such a way that it is directed at least from the first end of the piezoelectric transformer, which is mounted on the printed circuit board, to the second free end of the piezoelectric transformer. The current of working gas is used for the formation of the plasma and for cooling the piezoelectric transformer, where in this case the highest thermal power loss occurs at the vibration nodal points. A fan is provided to facilitate the flow of the working gas through the piezoelectric transformer to the second free end.

In a piezoelectric transformer, which is excited at a resonant frequency, at least two vibration nodal points are formed, where in this case both of them are spaced apart from the first end or from the second free end. According to one embodiment, one electrical connector on the printed circuit board is guided in each instance to a respective lateral face of the piezoelectric transformer. The connector is connected to a respective terminal pad, which is provided at a vibration nodal point on each lateral face of the piezoelectric transformer. The terminal pad is mounted at that vibration nodal point that is closer to the first end than to the second free end. Preferably a temperature sensor is provided at this vibration nodal point of the piezoelectric transformer, so that the temperature of the piezoelectric transformer can be monitored, so that the power is switched off, when the temperature exceeds a certain threshold value.

It is particularly advantageous, if the printed circuit board and the piezoelectric transformer form a structural unit. Then this structural unit can be used or more specifically can be installed as an integral whole in a housing.

A hand-held device for the plasma treatment of surfaces has at least a housing and a voltage source. With the plasma output from the hand-held device it is possible to clean a surface and to improve the adhesive properties of paint or adhesive. A printed circuit board with a control circuit for exciting a piezoelectric transformer is arranged in the housing, where in this case the piezoelectric transformer is mounted with a first end on the printed circuit board and, as a result, forms a structural unit with said printed circuit board. A second free end of the piezoelectric transformer is directed towards an opening in the housing. A high voltage is impressed on the second free end of the piezoelectric transformer, so that the plasma is formed at atmospheric pressure. In order to supply power, it is possible to provide a battery and/or a connector for a standard power supply.

The housing bears a fan, with which an air current can be produced through the piezoelectric transformer and towards the opening in the housing. The fan can be formed, as a function of the structural conditions of the housing, as an axial fan.

The hand-held device may be provided with an additional gas port. A working gas other than air can be fed through the gas port to the second free end of the piezoelectric transformer. It is also conceivable that the working gas coming by way of the gas port is mixed with the ambient air.

It is especially advantageous that the device of the invention can be used to produce an atmospheric pressure plasma by means of at least one piezoelectric transformer. The piezoelectric transformer is made of a piezoelectric material that is divided in the longitudinal direction into at least one excitation zone and at least one high voltage zone, where in this case the excitation zone has terminal pads, to which an AC voltage is applied, and wherein mechanical vibrations, which cause electrical fields to build up in the high voltage zone, can be produced in the excitation zone. In addition, the present invention can be integrated into a hand-held device. The hand-held device is easy to transport and, as a result, can reach any desired site without any special effort. Similarly the design of the power supply is simple, a feature that also positively supports its variability with respect to its potential applications.

According to the invention, the volume of the plasma that is produced per unit of time is maximized by geometric structures for local field enhancement. By structuring the high voltage side of the piezoelectric crystal, the volume of the plasma that is produced per unit of time is maximized. The structuring is in a direct positive engagement with the high voltage side of the piezoelectric crystal. The structuring is designed as a separate component that is electrically connected directly to the high voltage side of the piezoelectric crystal. In the region of the field enhancement a working gas (process gas) flows over the piezoelectric crystal (piezoelectric transformer).

BRIEF DESCRIPTION OF THE DRAWINGS

Additional advantages and advantageous embodiments of the invention are the subject matter of the following figures and the respective description thereof in which.

DETAILED DESCRIPTION OF THE INVENTION

Figure 1:
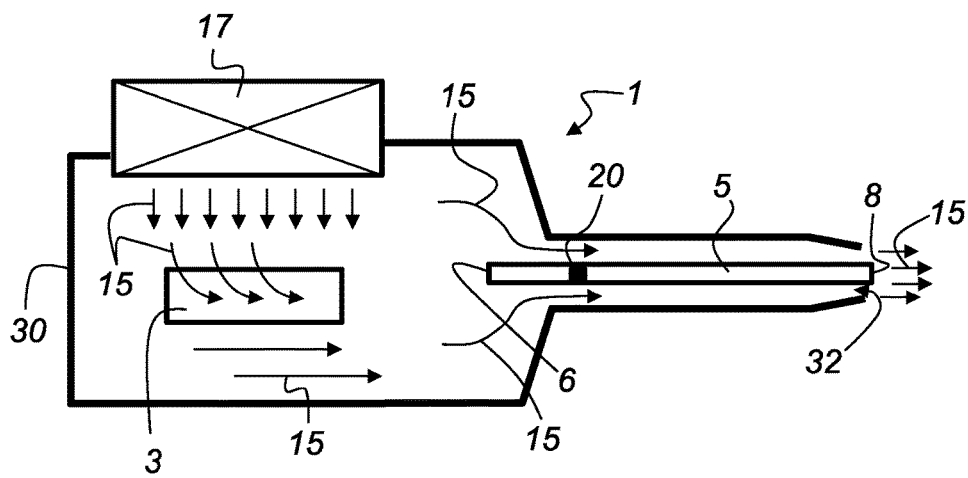
FIG. 1 is a schematic view of the basic principle of the inventive device, with which a plasma can be produced at atmospheric pressure.

The same reference numerals are used for identical or equivalent elements of the invention. The embodiment is shown merely for the purpose of illustrating a way, in which a device for producing a plasma and a hand-held device, into which the device for producing a plasma is installed, can be designed.

FIG. 1 is in schematic form a view of the basic principle of the inventive device 1, with which a plasma can be produced at atmospheric pressure. A piezoelectric transformer 5 is disposed in a housing 30. A second free end 8 of the piezoelectric transformer 5 is directed towards an opening 32 of the housing 30. The housing 30 is provided with a fan 17, which produces a current 15 of a working gas that is guided towards the opening 32 of the housing 30. The current 15 of working gas is guided by way of the control circuit 3 and the piezoelectric transformer 5 and is used essentially to cool the piezoelectric transformer 5. The arrangement of the fan 17 that is shown in FIG. 1 is not to be construed as limiting the invention. It should be appreciated that the fan 17 can be mounted at any point on the housing 30.

Figure 11:
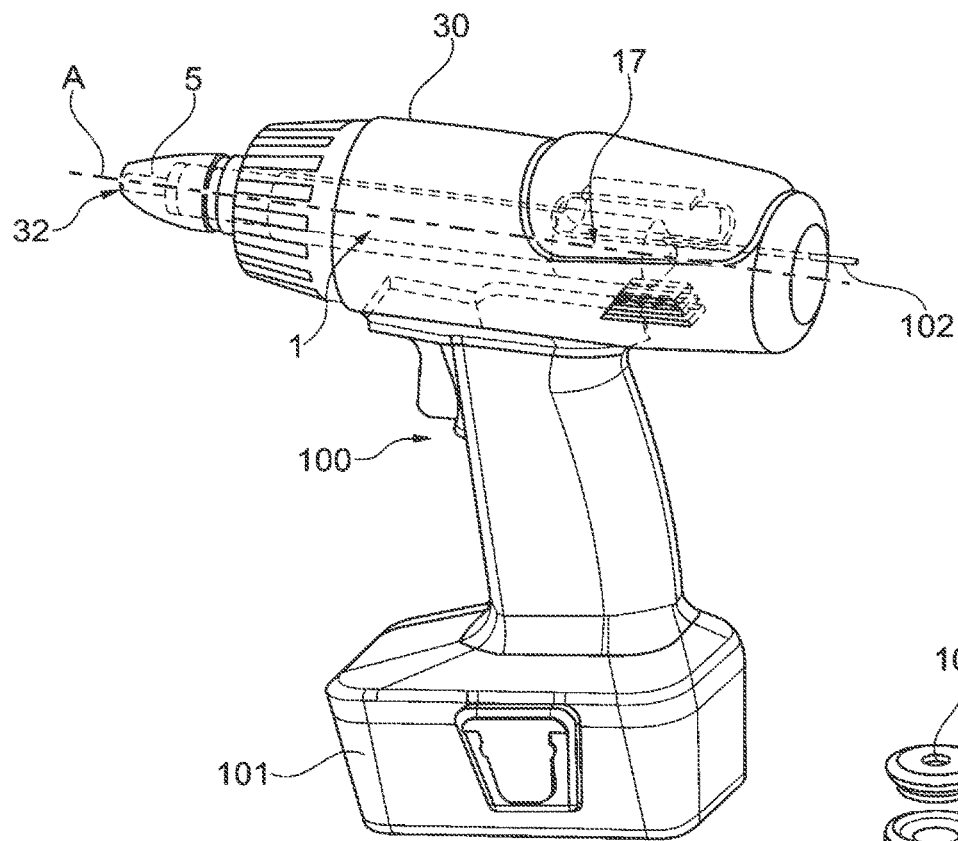
FIG. 11 is a possible embodiment of a hand-held device, which encloses the device of the invention; and, FIG. 12 is an additional embodiment of a hand-held device that encloses the device of the invention.

Each one of the lateral faces 10 of the piezoelectric transformer 5 has a terminal pad 20, by means of which the piezoelectric transformer 5 is supplied with such a voltage that the piezoelectric transformer 5 oscillates at a resonant frequency. In this respect the terminal pad 20 is located closer to the first end 6 of the piezoelectric transformer 5 than to the second free end 8. As shown in FIG. 11, the excited piezoelectric transformer 5 forms two vibration nodal points 14. Preferably, the terminal pads 20 are mounted at the vibration nodal point 14, which lies closer to the first end 6 of the piezoelectric transformer 5. Preferably, the piezoelectric transformer 5 is dimensioned in such a way that in a base mode two vibration nodal points 14 (see FIG. 9) are formed along the length of the piezoelectric transformer 5.

Figure 2:
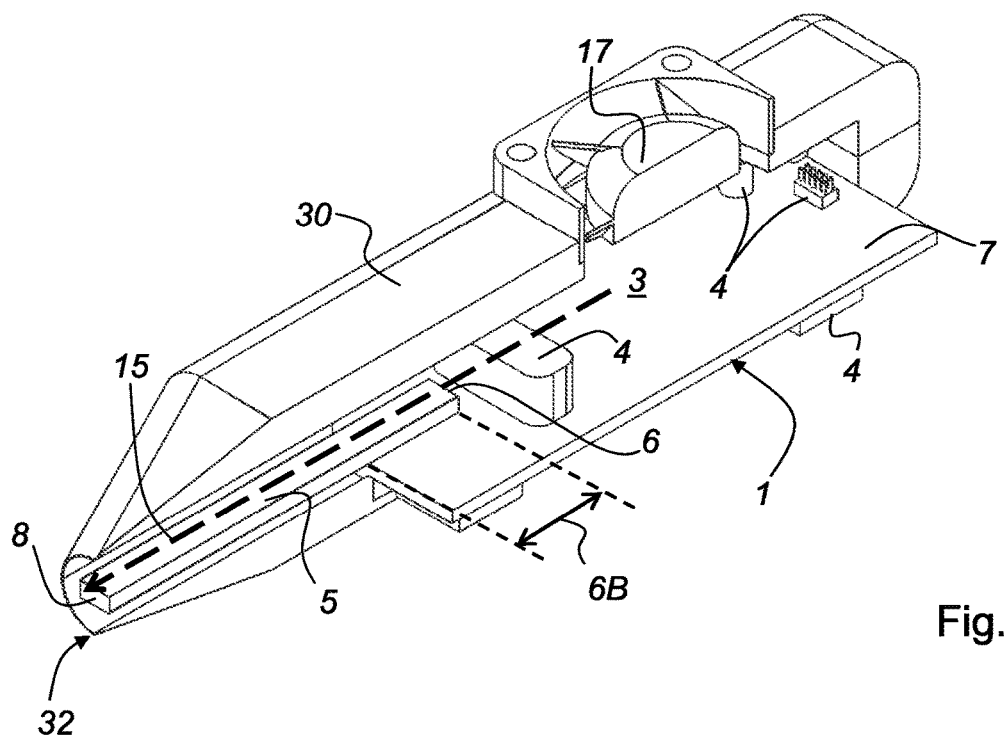
FIG. 2 is a sectional perspective view, where in this case the device of the invention is enclosed by a housing.

FIG. 2 shows a sectional perspective view of the housing 30, which encloses the device 1 of the invention. The piezoelectric transformer 5 is mounted on a printed circuit board 7, on which a control circuit 3 is realized. The control circuit in turn is constructed of a plurality of electronic components 4, where in this case only some of the electronic components 4 are shown for the sake of clarity. According to a first embodiment, the piezoelectric transformer 5 may be located with a region 6B of the first end 6 opposite the printed circuit board 7 and is mounted, as described below, in such a way that it is spaced apart from said printed circuit board. The housing 30 has the opening 32, in which the second free end 8 of the piezoelectric transformer 5 terminates. A high voltage is applied to the second free end 8 of the piezoelectric transformer 5, so that a plasma P (see FIG. 5) is formed at atmospheric pressure. A current 15 of working gas is produced with the fan 17, as already described above, so that with the working gas the plasma P can be formed on the second free end 8 of the piezoelectric transformer 5.

Figure 3:
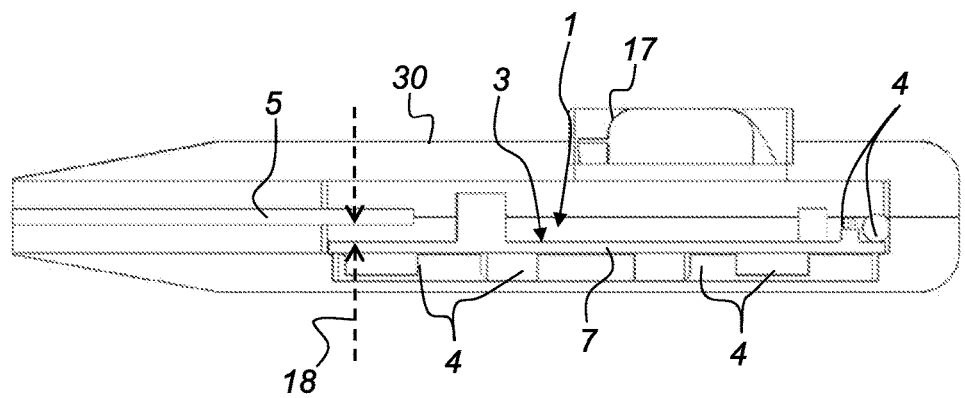
FIG. 3 is a side view of the inventive device in the housing.

FIG. 3 shows a side view of the inventive device 1 in the housing 30. As can be seen from FIG. 2 as well as from FIG. 3, the piezoelectric transformer 5 and the printed circuit board 7, which bears the control circuit 3, which is constructed from a plurality of electronic components 4, form a structural unit. As a result, the device 1 of the invention can be prefabricated as the structural unit and then installed in the housing 30 that is provided for this purpose. In this drawing it is possible to see a free gap 18 between the printed circuit board 7 and the piezoelectric transformer 5.

Figure 4:
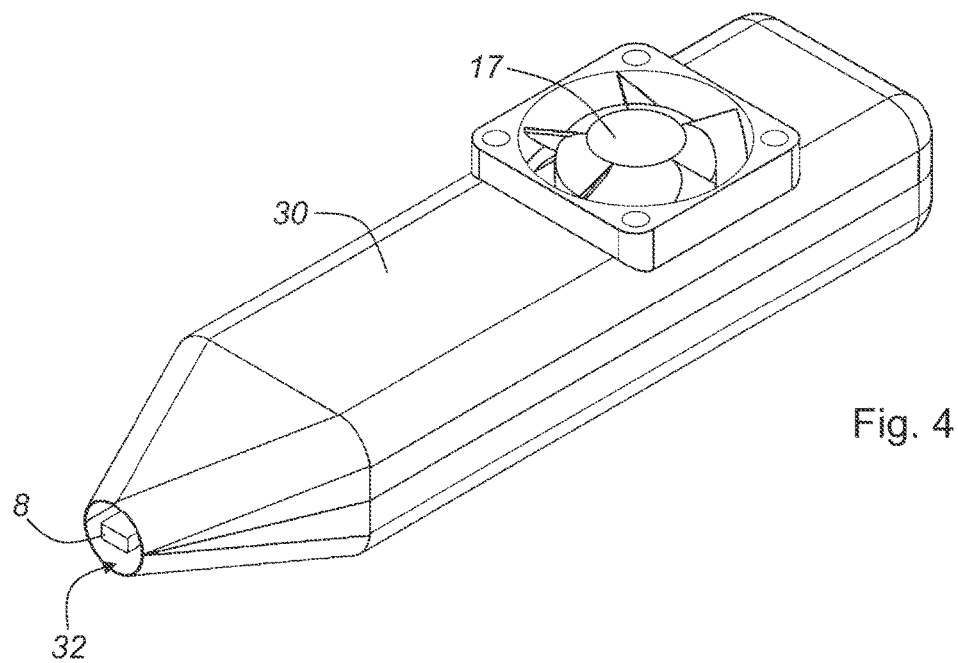
FIG. 4 is a perspective view of an embodiment of the housing, in which the device of the invention is accommodated.

FIG. 4 is a perspective view of an embodiment of the housing 30. The device 1 of the invention is accommodated in the housing 30. In the drawing of the inventive device 1 that is shown here it is possible to see only the second free end 8 of the piezoelectric transformer 5 that terminates in the opening 32 of the housing 30.

Figure 5:
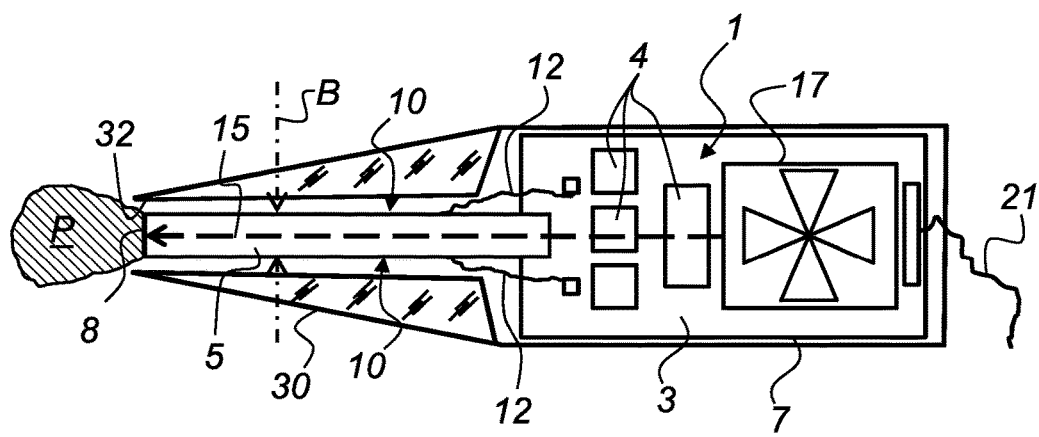
FIG. 5 is a plan view of the device according to the invention.

FIG. 5 is in schematic form a plan view of the device 1 according to the invention. As already mentioned several times in the above description, the inventive device 1 is a structural unit comprising the piezoelectric transformer 5 and the printed circuit board 7. The printed circuit board 7 realizes with a plurality of electronic components 4 a control circuit 3. With the control circuit 3 it is possible to excite the piezoelectric transformer 5 at its resonant frequency. The inventive device 1 can be connected to an external power supply, which is a conventional standard power supply (not shown), which is connected by means of a cable 21 to the inventive device 1. Similarly the inventive device can be provided with a battery. A combination of a battery and a standard power supply is also conceivable. The driving voltage is applied from the control circuit 3 of the printed circuit board 7 by way of each electrical connector 12 to the respective lateral face 10 of the piezoelectric transformer 5. The excitation voltage, which is applied to the lateral faces 10 of the piezoelectric transformer 5 causes a high voltage to be formed on the second free end 8 of the piezoelectric transformer 5. The fan 17, which is assigned to the device 1 of the invention, produces a current 15 of working gas, with which the plasma P is ignited and maintained on the second free end 8. The plasma P issues through the opening 32 of the housing, in which the inventive device 1 is located. The ignition and the maintenance of the plasma P is carried out at atmospheric pressure.

Figure 6:
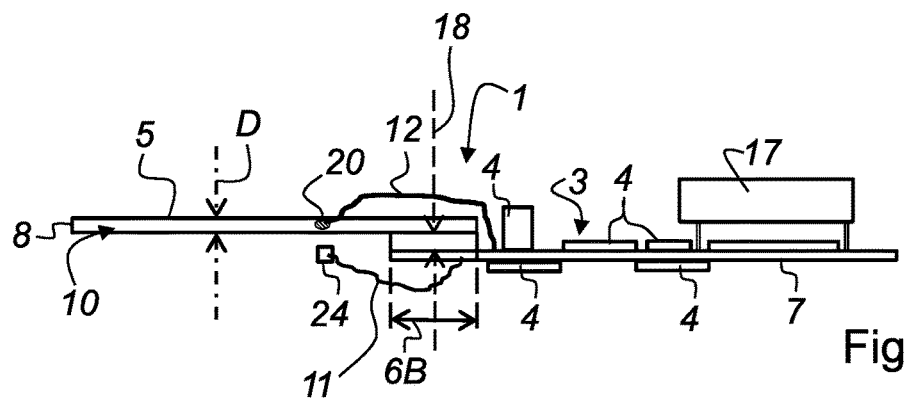
FIG. 6 is a side view of the device according to the invention.

FIG. 6 is a side view of the device 1 according to the invention. The control circuit 3 is realized with a plurality of electrical components 4 on the printed circuit board 7. The piezoelectric transformer 5 is freely arranged with the region 6B of the first end 6 above the printed circuit board 7. The terminal pad 20 for the electrical connector 12 from the printed circuit board 7 is mounted on each of the lateral faces 10 of the piezoelectric transformer 5. The electrical terminal pads 20 are mounted on both lateral faces 10 of the piezoelectric transformer 5 and at the vibration nodal point 14 (see FIG. 9) of said piezoelectric transformer. Similarly the mechanical mounting or more specifically the guiding of the piezoelectric transformer 5 at the vibration nodal point 14 is carried out in the same way. Therefore, the mechanical mounting or more specifically the guiding of the piezoelectric transformer 5 is carried out in such a way that between the printed circuit board 7 and the piezoelectric transformer 5 there is a gap 18. With the device 1 of the invention it is possible to produce a high voltage on the second free end 8 of the piezoelectric transformer 5, if a low voltage of, for example, 12 V of AC voltage (12 V peak-to-peak) is applied to the two terminal pads 20. As already mentioned several times, a fan 17 is associated with the printed circuit board 7; and this fan provides the air flow required for cooling the piezoelectric transformer 5. The terminal pad 20 may be assigned a temperature sensor 24, which determines the temperature in the region of the terminal pad 20. The signals of the temperature sensor 24 can be guided to the printed circuit board 7 by means of a connection 11. As explained in the description with respect to FIG. 11, the thermal power loss is the greatest in the region of the terminal pad 20 (position of the vibration nodal point 14). FIG. 6 shows the measurement principle of the temperature sensor 2 as a non-contact measuring principle. It is also conceivable that the temperature sensor 24 is soldered into the terminal pad 20. It is clear from the description with respect to FIG. 5 and FIG. 6 that the piezoelectric transformer 5 has a width B and a thickness D.

Figure 7:
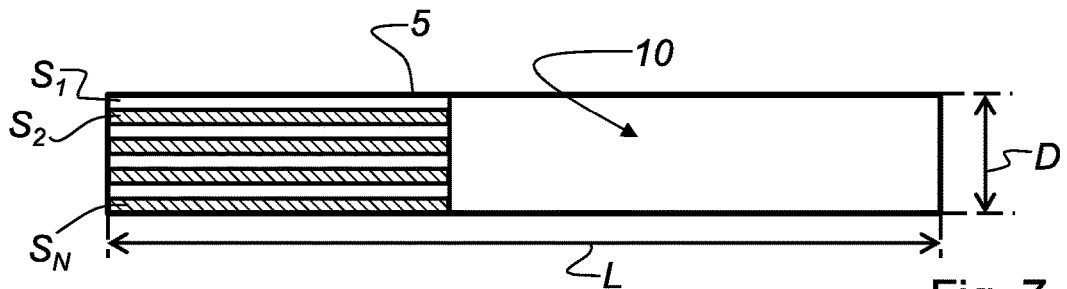
FIG. 7 is a side view of the piezoelectric transformer to illustrate the layer configuration.
Figure 8:
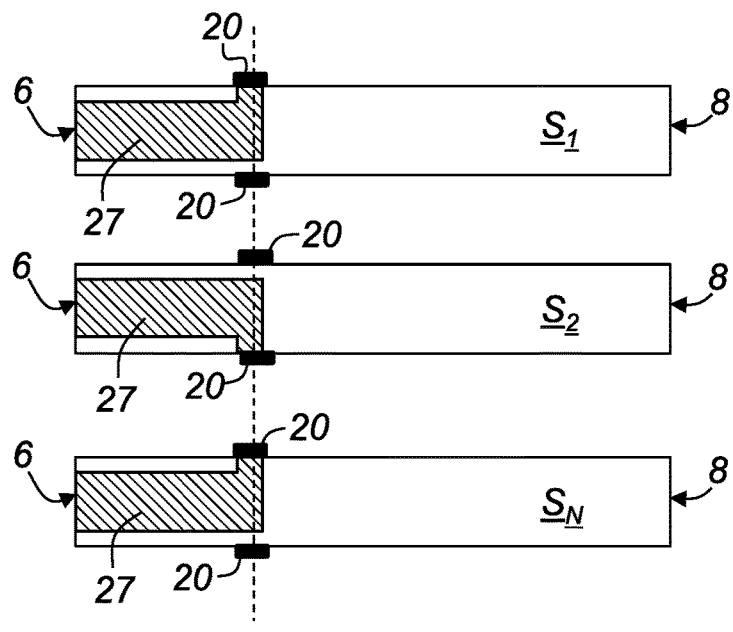
FIG. 8 is a plan view of the individual layers of the piezoelectric transformer in order to illustrate the contact that is made with the lateral connectors in order to feed in the excitation energy.

FIG. 7 shows in schematic form a side view of the piezoelectric transformer 5 to illustrate the layer configuration of the piezoelectric transformer 5. The piezoelectric transformer 5 is constructed from a plurality of layers $S_1$, $S_2, \ldots, S_N$ at least partly over its length L, where in this case the layers are more or less perpendicular to the lateral face 10 that is defined by the length L and the thickness D of the piezoelectric transformer 5. The piezoelectric transformer 5 consists of a stack of a plurality of films of dielectric material, where in this case a conductor track is applied to a section of each film. The individual films are connected to each other in a sintering process, and in this way the piezoelectric transformer is formed. FIG. 8 shows the electrical contact that is made with the individual layers $S_1$, $S_2, \ldots, S_N$. As already mentioned in the preceding description, each of the lateral faces 10 is provided with a terminal pad 20, which extends over the entire thickness D of the piezoelectric transformer 5. Each of the layers $S_1$, $S_2, \ldots, S_N$ is provided with an L-shaped conductor layer 27. The L-shaped conductor layers 27 are arranged in the layer system in such a way that contact is made in an alternating manner with one of the two terminal pads 20, as a result of which the individual layers $S_1, S_2, \ldots, S_N$ are connected in parallel. As already mentioned above, the terminal pads 20 are mounted on both lateral faces 10 of the piezoelectric transformer 5 at its vibration nodal point.

Figure 9A:
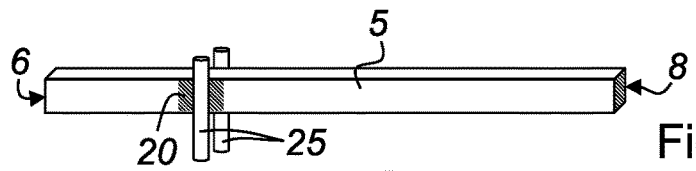
FIGS. 9a to 9b are schematic views of different ways of mounting the piezoelectric transformer.
Figure 9B:
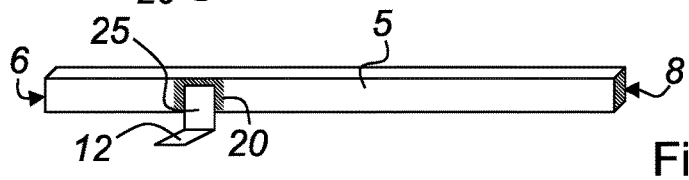
Figure 10:
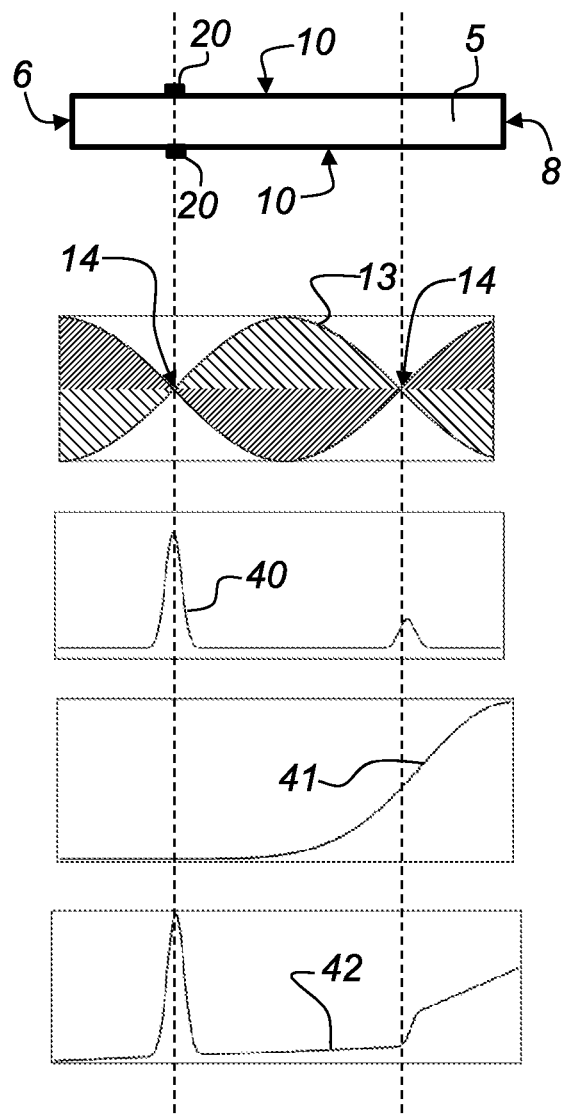
FIG. 10 is a view of the various physical states, as a function of the length of the piezoelectric transformer.

FIGS. 9a and 9b disclose various embodiments of the mounting or more specifically the guiding of the piezoelectric transformer 5. FIG. 9a shows the holder 25 of the piezoelectric transformer 5 according to the pin-in-hole technology (through-hole technology, THT). According to this embodiment, the holder 25 consists of two pins, which form the passage for the through-hole assembly, into which the piezoelectric transformer 5 is inserted and held. The type of mounting of the piezoelectric transformer 5 that is shown in FIG. 9b is that of a surface mounted component (surface-mounted device, SMD). The electrical connectors 12 are mounted directly on the printed circuit board (not shown here) by means of solderable terminal pads. The electrical connectors 12 hold the piezoelectric transformer 5 at its terminal pads 20 by means of appropriate elements, which form the holder 25. According to the embodiment shown in FIG. 9b, the holder 25 consists of flat elements. It is advantageous if the material of the holder 25 is elastic and electrically conductive. FIG. 10 shows a view of the various physical states as a function of the length of the piezoelectric transformer 5. The excitation of the piezoelectric transformer 5 in the region of its resonant frequency leads to the formation of a vibration mode 13, which forms two vibration nodal points 14 in the piezoelectric transformer 5. The terminal pads 20 are positioned at that vibration nodal point 14 that is closer to the first end 6 of the piezoelectric transformer 5. The vibration of the piezoelectric transformer 5 causes the occurrence of a thermal power loss 40 that is the greatest in the region of the first end 6 of the piezoelectric transformer 5 at the vibration nodal point 14. A thermal power loss 40 occurs at each vibration nodal point 14. The E-field profile 41 on the second free end 8 of the piezoelectric transformer 5 is such that a maximum is formed there. The rate of flow 42 of the working gas is the greatest at the vibration nodal point 14 in the region of the first end 6. Starting from the vibration nodal point 14, in the region of the second free end 6, the flow rate 42 increases as far as to the second free end 8.

FIG. 11 shows a possible embodiment of a hand-held device 100, which encloses the device 1 of the invention. The hand-held device 100 is cordless and is supplied with power by means of a battery 101 (typically 12V) in order to excite the piezoelectric transformer 5. In addition, it is possible to provide a gas port 102, by means of which the hand-held device 100 is supplied with a working gas, which is not air. Furthermore, a fan 17 is provided that acts in the direction of an axis A of the device 1 according to the invention. The fan 17 ensures that inside the hand-held device 100 the working gas (typically ambient air) is fed to the second free end of the piezoelectric transformer 5. The flowing working gas also ensures that the piezoelectric transformer 5 is cooled and, in so doing, ensures that the thermal power losses are carried away. The hand-held device 100 has a housing 30, in which the device 1 is received as a component.

Figure 12:
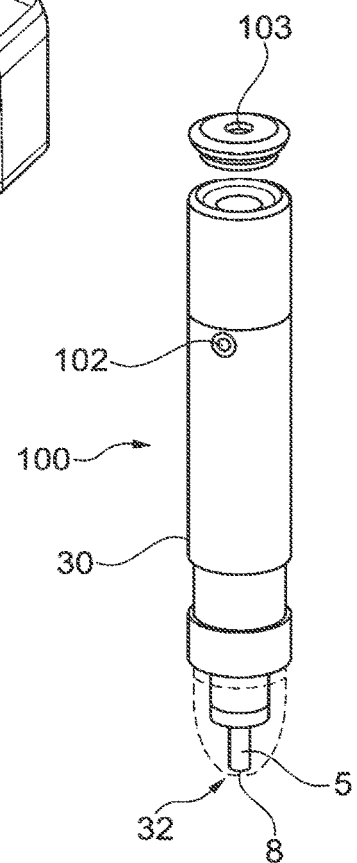

FIG. 12 shows an additional embodiment of a hand-held device 100 that encloses the device 1 of the invention. The hand-held device 100 is designed with a connector 103 for a cable of a standard power supply. Similarly it is possible to provide an additional gas port 102, by means of which the hand-held device 100 is supplied with a working gas (except ambient air). The hand-held device 100 has a cylindrical shape, so that the interior of the housing 30 also provides a fan (not shown in this embodiment) that pushes the working gas in the direction of the opening 32 of the housing 30 or more specifically to the second free end 8 of the piezoelectric transformer 5.

Although the present description discloses only two embodiments for hand-held devices 100, it is not to be construed as limiting the invention. It should be appreciated that the housing 30 of the hand-held device 100 can take different shapes. The relevant feature is only that an opening 32 is formed in the housing 30, so that the plasma P can issue at atmospheric pressure.

LIST OF REFERENCE NUMERALS

1 Device
3 Control circuit
4 Electronic component
5 Piezoelectric transformer
6 First end
6B Region
7 Printed circuit board
8 Second free end
10 Lateral face
11 Connection
12 Electrical connector
13 Vibration mode
14 Vibration nodal point
15 Current of a working gas
17 Fan
18 Gap
20 Terminal pad
21 Cable of a power supply
24 Temperature sensor
25 Holder
27 Conductor layer
28 Shell
30 Housing
32 Opening
40 Thermal power loss
41 E-field profile
42 Flow rate
50 Voltage source
100 Hand-held device
101 Battery
102 Gas port
103 Connector
A Axis of the device
L Length
B Width
D Thickness
P Plasma
$S_1, S_2, \ldots, S_N$ Layers

The invention claimed is:

1. An apparatus for producing a plasma which can be ignited at atmospheric pressure, comprising:
 a printed circuit board;
 a control circuit embodied within said printed circuit board, which circuit is electrically connected to a piezoelectric transformer, to excite said piezoelectric transformer, wherein said piezo electric transformer comprises a fixed first end mounted to said printed circuit board; and a free second end, said control circuit operatively arranged to impress a high voltage on said second free end of the piezoelectric transformer and to control a fan to create a current of a working gas for forming the plasma and for cooling the piezoelectric transformer, wherein;
 the piezoelectric transformer is constructed from a plurality of layers of dielectric material, wherein the layers are connected to each other, each layer is provided at least partially with a conductor layer and the piezoelectric transformer is freely spaced apart from the printed circuit board by a gap in the region of the first end; and
 an electrical connector is guided from the printed circuit board to each lateral face of the piezoelectric transformer and is connected to each terminal pad, which is provided at a vibrational nodal point on each lateral face of the piezoelectric transformer, wherein the vibrational nodal point is closer to the first end than to the second free end of the piezoelectric transformer.

2. The apparatus as recited in claim 1, wherein the piezoelectric transformer is parallel pipe-shaped, and a length and a width of the piezoelectric transformer are greater than one thickness of the piezoelectric transformer.

3. The apparatus as recited in claim 1, wherein an electrical terminal pad for an excitation voltage at a vibration nodal point of the piezoelectric transformer is mounted on opposite lateral faces of the piezoelectric transformer, said lateral faces being defined by a length and a thickness of the piezoelectric transformer.

4. The apparatus as recited in claim 3, wherein a holder bears the piezoelectric transformer above the printed circuit board at the vibration nodal point and the holder is made of an elastic material.

5. The apparatus as recited in claim 1, wherein the current of the working gas is formed in such a way that it is directed at least from the first end of the piezoelectric transformer, mounted on the printed circuit board, towards the second free end of the piezoelectric transformer.

6. The apparatus as recited in claim 5, wherein a fan is provided that supports the current of the working gas by way of the piezoelectric transformer towards the second free end of the piezoelectric transformer.

7. The apparatus as recited in claim 1, wherein at least two vibration nodal points, both of which are spaced apart from the first end or from the second free end, can be formed in the piezoelectric transformer, which is excited at a resonant frequency.

8. The apparatus as recited in claim 7, wherein a temperature sensor is assigned to at least one vibration nodal point of the piezoelectric transformer.

9. The apparatus as recited in claim 7, wherein the electrical connector, the holder for the piezoelectric transformer and the holder are made of a material that is elastic and electrically conductive.

10. The apparatus as recited in claim 1, wherein the printed circuit board and the piezoelectric transformer form a structural unit.

11. A hand-held device for plasma treatment of surfaces, said hand-held device comprising:
 a housing;
 a voltage source;
 a printed circuit board, which is provided in the housing and which has a control circuit in order to excite a piezoelectric transformer wherein the piezoelectric transformer is guided with a first end with a holder above the printed circuit board and, thus, forms a structural unit, and wherein a second free end of the piezoelectric transformer is directed towards an opening in the housing, wherein a high voltage can be impressed on the second free end of the piezoelectric transformer, and the plasma can be ignited at atmospheric pressure;
 a working gas for forming the plasma and for cooling the piezoelectric transformer;

wherein the piezoelectric transformer is constructed from a plurality of layers of dielectric material, wherein the layers are connected to each other; and wherein each layer is provided at least partially with a conductor layer and the piezoelectric transformer is freely spaced apart from the printed circuit board by a gap in a region of the first end; and, an electrical connector is guided from the printed circuit board to each lateral face of the piezoelectric transformer and is connected to each terminal pad, which is provided at a vibrational nodal point on each lateral face of the piezoelectric transformer, wherein the vibrational nodal point is closer to the first end than to the second free end of the piezoelectric transformer.

12. The hand-held device as recited in claim 11, wherein a battery and/or a connector for a standard power supply is provided, so that a power supply of the hand-held device can be carried out.

13. The hand-held device as recited in claim 11, wherein the housing bears a fan, with which an air current can be produced towards the opening in the housing by way of the piezoelectric transformer.

14. The hand-held device as recited in claim 11, wherein an additional gas port is provided, by means of which a working gas other than air can be fed to the second free end of the piezoelectric transformer.

* * * * *